US 8,184,845 B2

(12) United States Patent
Leidl et al.

(10) Patent No.: US 8,184,845 B2
(45) Date of Patent: May 22, 2012

(54) ELECTRICAL MODULE COMPRISING A MEMS MICROPHONE

(75) Inventors: Anton Leidl, Hohenbrunn (DE); Wolfgang Pahl, Munich (DE); Ulrich Wolff, Kaiserslautern (DE)

(73) Assignee: Epcos AG, Munich (DE)

( * ) Notice: Subject to any disclaimer, the term of this patent is extended or adjusted under 35 U.S.C. 154(b) by 1124 days.

(21) Appl. No.: 11/816,964

(22) PCT Filed: Feb. 8, 2006

(86) PCT No.: PCT/EP2006/001116
§ 371 (c)(1),
(2), (4) Date: Jan. 8, 2008

(87) PCT Pub. No.: WO2006/089638
PCT Pub. Date: Aug. 31, 2006

(65) Prior Publication Data
US 2008/0247585 A1    Oct. 9, 2008

(30) Foreign Application Priority Data

Feb. 24, 2005 (DE) .......................... 10 2005 008 512

(51) Int. Cl.
*H04R 1/00* (2006.01)
(52) U.S. Cl. ....................... 381/369; 257/416
(58) Field of Classification Search .......... 257/414–420, 257/678, 685, 686; 381/170–175, 189–191, 381/355–358, 369, 150
See application file for complete search history.

(56) References Cited

U.S. PATENT DOCUMENTS

| 2,105,010 | A |   | 1/1938  | Sawyer              |         |
|-----------|---|---|---------|---------------------|---------|
| 3,447,217 | A |   | 6/1969  | Kumada              |         |
| 3,587,322 | A |   | 6/1971  | Lobdell et al.      |         |
| 3,726,002 | A |   | 4/1973  | Greenstein et al.   |         |
| 3,735,211 | A |   | 5/1973  | Kapnias             |         |
| 3,980,917 | A | * | 9/1976  | Kakizaki et al.     | 313/383 |
| 4,127,840 | A |   | 11/1978 | House               |         |
| 4,222,277 | A |   | 9/1980  | Kurtz               |         |
| 4,277,814 | A |   | 7/1981  | Giachino et al.     |         |
| 4,314,226 | A |   | 2/1982  | Oguro et al.        |         |
| 4,424,419 | A |   | 1/1984  | Chaput et al.       |         |
| 4,454,440 | A |   | 6/1984  | Cullen              |         |
| 4,456,796 | A |   | 6/1984  | Nakagawa et al.     |         |
| 4,504,703 | A |   | 3/1985  | Schneiter et al.    |         |

(Continued)

FOREIGN PATENT DOCUMENTS

CA         2315417         2/2001

(Continued)

OTHER PUBLICATIONS

International Search Report for PCT/EP06/001116.

(Continued)

*Primary Examiner* — Ha Tran T Nguyen
*Assistant Examiner* — Kevin Quinto
(74) *Attorney, Agent, or Firm* — Fish & Richardson P.C.

(57) ABSTRACT

An electrical module includes a base plate having an acoustic channel that opens into a first cavity at a first end and that is closed off by a microphone chip at a second end. The microphone chip borders a second cavity that opens to an exterior of the electrical module. The second cavity is separated from the acoustic channel by the microphone chip.

16 Claims, 3 Drawing Sheets

U.S. PATENT DOCUMENTS

| | | | |
|---|---|---|---|
| 4,533,795 A | 8/1985 | Baumhauer |
| 4,545,440 A | 10/1985 | Treadway |
| 4,558,184 A | 12/1985 | Busch-Vishniac et al. |
| 4,628,740 A | 12/1986 | Ueda et al. |
| 4,641,054 A | 2/1987 | Takahata et al. |
| 4,691,363 A | 9/1987 | Khanna |
| 4,737,742 A | 4/1988 | Takoshima et al. |
| 4,776,019 A | 10/1988 | Miyatake |
| 4,816,125 A | 3/1989 | Muller et al. |
| 4,817,168 A | 3/1989 | Fidi |
| 4,825,335 A | 4/1989 | Wilner |
| 4,866,683 A | 9/1989 | Phillips |
| 4,908,805 A | 3/1990 | Sprenkels et al. |
| 4,910,840 A | 3/1990 | Sprenkels et al. |
| 4,984,268 A | 1/1991 | Brown et al. |
| 5,059,848 A | 10/1991 | Mariani |
| 5,091,051 A | 2/1992 | Greer |
| 5,101,543 A | 4/1992 | Cote et al. |
| 5,146,435 A | 9/1992 | Bernstein |
| 5,151,763 A | 9/1992 | Marek et al. |
| 5,153,379 A | 10/1992 | Guzuk et al. |
| 5,178,015 A | 1/1993 | Loeppert et al. |
| 5,184,107 A | 2/1993 | Maurer |
| 5,216,490 A | 6/1993 | Greiff et al. |
| 5,257,547 A | 11/1993 | Boyer |
| 5,357,807 A | 10/1994 | Guckel et al. |
| 5,394,011 A | 2/1995 | Yamamoto et al. |
| 5,408,731 A | 4/1995 | Berggvist et al. |
| 5,449,909 A | 9/1995 | Kaiser et al. |
| 5,452,268 A | 9/1995 | Bernstein |
| 5,459,368 A | 10/1995 | Onishi et al. |
| 5,465,008 A | 11/1995 | Goetz et al. |
| 5,477,008 A | 12/1995 | Pasqualoni et al. |
| 5,490,220 A | 2/1996 | Loeppert |
| 5,506,919 A | 4/1996 | Roberts |
| 5,531,787 A | 7/1996 | Lesinski et al. |
| 5,545,912 A | 8/1996 | Ristic et al. |
| 5,573,435 A | 11/1996 | Grabbe et al. |
| 5,592,391 A | 1/1997 | Muyshondt et al. |
| 5,593,926 A | 1/1997 | Fujihira |
| 5,650,685 A | 7/1997 | Kosinski et al. |
| 5,659,195 A | 8/1997 | Kaiser et al. |
| 5,712,523 A | 1/1998 | Nakashima et al. |
| 5,739,585 A | 4/1998 | Akram et al. |
| 5,740,261 A | 4/1998 | Loeppert et al. |
| 5,748,758 A | 5/1998 | Menasco, Jr. et al. |
| 5,821,665 A | 10/1998 | Onishi et al. |
| 5,831,262 A | 11/1998 | Greywall et al. |
| 5,838,551 A | 11/1998 | Chan |
| 5,852,320 A | 12/1998 | Ichihashi |
| 5,870,482 A | 2/1999 | Loeppert et al. |
| 5,872,397 A | 2/1999 | Diffenderfer et al. |
| 5,886,876 A | 3/1999 | Yamaguchi |
| 5,889,872 A | 3/1999 | Sooriakumar et al. |
| 5,901,046 A | 5/1999 | Ohta et al. |
| 5,923,995 A | 7/1999 | Kao et al. |
| 5,939,968 A | 8/1999 | Nguyen et al. |
| 5,990,418 A | 11/1999 | Bivona et al. |
| 5,999,821 A | 12/1999 | Kaschke |
| 6,012,335 A | 1/2000 | Bashir et al. |
| 6,052,464 A | 4/2000 | Harris |
| 6,057,222 A | 5/2000 | Pahl et al. |
| 6,075,867 A | 6/2000 | Bay et al. |
| 6,078,245 A | 6/2000 | Fritz et al. |
| 6,108,184 A | 8/2000 | Minervini et al. |
| 6,118,881 A | 9/2000 | Quinlan et al. |
| 6,136,175 A | 10/2000 | Stelzl et al. |
| 6,136,419 A | 10/2000 | Fasano et al. |
| 6,150,753 A | 11/2000 | DeCastro |
| 6,157,546 A | 12/2000 | Petty et al. |
| 6,163,071 A | 12/2000 | Yamamura |
| 6,178,249 B1 | 1/2001 | Hietanen et al. |
| 6,182,342 B1 | 2/2001 | Sawin |
| 6,187,249 B1 | 2/2001 | Lewellin |
| 6,191,928 B1 | 2/2001 | Rector et al. |
| 6,242,842 B1 | 6/2001 | Pahl et al. |
| 6,282,072 B1 | 8/2001 | Minervini et al. |
| 6,310,420 B1 | 10/2001 | Pahl et al. |
| 6,324,907 B1 | 12/2001 | Halteren et al. |
| 6,398,943 B1 | 6/2002 | Arens-Fischer et al. |
| 6,400,065 B1 | 6/2002 | Toda et al. |
| 6,413,408 B1 | 7/2002 | Berger et al. |
| 6,433,412 B2 | 8/2002 | Ando et al. |
| 6,437,449 B1* | 8/2002 | Foster ............................ 257/777 |
| 6,439,869 B1 | 8/2002 | Seng et al. |
| 6,449,828 B2 | 9/2002 | Pahl et al. |
| 6,492,194 B1 | 12/2002 | Bureau et al. |
| 6,519,822 B1 | 2/2003 | Stelzl et al. |
| 6,522,762 B1 | 2/2003 | Mullenborn |
| 6,528,924 B1 | 3/2003 | Stelzl et al. |
| 6,530,515 B1 | 3/2003 | Glenn et al. |
| 6,555,758 B1 | 4/2003 | Stelzl et al. |
| 6,566,672 B1 | 5/2003 | Schlough et al. |
| 6,594,369 B1 | 7/2003 | Une |
| 6,613,605 B2 | 9/2003 | Pace |
| 6,614,911 B1 | 9/2003 | Watson et al. |
| 6,621,392 B1 | 9/2003 | Volant et al. |
| 6,625,031 B2 | 9/2003 | Sano et al. |
| 6,649,446 B1 | 11/2003 | Goetz et al. |
| 6,674,159 B1 | 1/2004 | Peterson et al. |
| 6,685,168 B1 | 2/2004 | Stelzl et al. |
| 6,710,840 B2 | 3/2004 | Umemoto |
| 6,722,030 B1 | 4/2004 | Stelzl et al. |
| 6,732,588 B1 | 5/2004 | Mullenborn et al. |
| 6,781,231 B2 | 8/2004 | Minervini |
| 6,800,987 B2 | 10/2004 | Toda |
| 6,809,413 B1 | 10/2004 | Peterson et al. |
| 6,829,131 B1 | 12/2004 | Loeb et al. |
| 6,838,739 B2 | 1/2005 | Stelzl et al. |
| 6,838,972 B1 | 1/2005 | Minervini |
| 6,904,155 B2 | 6/2005 | Yonehara et al. |
| 6,909,183 B2 | 6/2005 | Feiertag et al. |
| 6,924,429 B2 | 8/2005 | Kasai et al. |
| 6,924,974 B2 | 8/2005 | Stark |
| 6,930,364 B2 | 8/2005 | Bruner |
| 6,982,380 B2 | 1/2006 | Hoffmann et al. |
| 7,003,127 B1 | 2/2006 | Sjursen |
| 7,053,456 B2 | 5/2006 | Matsuo |
| 7,072,482 B2 | 7/2006 | Van Doorn et al. |
| 7,080,442 B2 | 7/2006 | Kawamura et al. |
| 7,092,539 B2 | 8/2006 | Sheplak et al. |
| 7,094,626 B2 | 8/2006 | Stelzl et al. |
| 7,146,016 B2 | 12/2006 | Pedersen |
| 7,166,910 B2 | 1/2007 | Minervini |
| 7,242,089 B2 | 7/2007 | Minervini |
| 7,259,041 B2 | 8/2007 | Stelzl et al. |
| 7,298,856 B2 | 11/2007 | Tajima et al. |
| 7,381,589 B2 | 6/2008 | Minervini |
| 7,388,281 B2 | 6/2008 | Krueger et al. |
| 7,434,305 B2 | 10/2008 | Minervini |
| 7,439,616 B2 | 10/2008 | Minervini |
| 7,492,019 B2 | 2/2009 | Carley |
| 7,518,201 B2 | 4/2009 | Stelzl et al. |
| 7,518,249 B2 | 4/2009 | Krueger et al. |
| 7,537,964 B2 | 5/2009 | Minervini |
| 7,544,540 B2 | 6/2009 | Bauer et al. |
| 7,608,789 B2 | 10/2009 | Kruger et al. |
| 7,692,288 B2 | 4/2010 | Zhe |
| 7,903,831 B2 | 3/2011 | Song |
| 8,018,049 B2 | 9/2011 | Minervini |
| 2001/0010444 A1 | 8/2001 | Pahl et al. |
| 2002/0067663 A1 | 6/2002 | Loeppert et al. |
| 2002/0074239 A1 | 6/2002 | Berger et al. |
| 2002/0076910 A1 | 6/2002 | Pace |
| 2002/0102004 A1* | 8/2002 | Minervini ...................... 381/175 |
| 2002/0110256 A1 | 8/2002 | Watson et al. |
| 2003/0010530 A1 | 1/2003 | Scheel et al. |
| 2003/0034536 A1 | 2/2003 | Scheeper et al. |
| 2003/0035558 A1 | 2/2003 | Kawamura et al. |
| 2003/0047806 A1 | 3/2003 | Stelzl et al. |
| 2003/0124829 A1 | 7/2003 | Pace |
| 2003/0133588 A1 | 7/2003 | Pedersen |
| 2003/0151133 A1 | 8/2003 | Kinayman et al. |
| 2003/0153116 A1 | 8/2003 | Carley et al. |
| 2004/0032705 A1 | 2/2004 | Ma |
| 2004/0046245 A1 | 3/2004 | Minervini |
| 2004/0058473 A1 | 3/2004 | Feiertag et al. |

| | | | |
|---|---|---|---|
| 2004/0064941 A1 | 4/2004 | Dozier et al. |
| 2004/0118595 A1 | 6/2004 | Flammer et al. |
| 2004/0150939 A1 | 8/2004 | Huff |
| 2004/0161530 A1 | 8/2004 | Stark |
| 2004/0231872 A1 | 11/2004 | Arnold et al. |
| 2004/0237299 A1 | 12/2004 | Stelzl et al. |
| 2004/0239449 A1 | 12/2004 | Stelzl et al. |
| 2005/0018864 A1 | 1/2005 | Minervini |
| 2005/0034888 A1 | 2/2005 | Hoffman et al. |
| 2005/0069164 A1 | 3/2005 | Muthuswamy et al. |
| 2005/0121785 A1 | 6/2005 | Stelzl et al. |
| 2005/0185812 A1 | 8/2005 | Minervini |
| 2005/0218488 A1 | 10/2005 | Matsuo |
| 2005/0242420 A1 | 11/2005 | Matsuda et al. |
| 2006/0151203 A1 | 7/2006 | Krueger et al. |
| 2006/0157841 A1 | 7/2006 | Minervini |
| 2006/0249802 A1 | 11/2006 | Stelzl et al. |
| 2007/0069354 A1 | 3/2007 | Dangelmaier et al. |
| 2007/0082421 A1 | 4/2007 | Minervini |
| 2007/0099327 A1 | 5/2007 | Hartzell et al. |
| 2007/0127982 A1 | 6/2007 | Bohlen et al. |
| 2007/0189558 A1 | 8/2007 | Ogura et al. |
| 2007/0201715 A1 | 8/2007 | Minervini |
| 2007/0202627 A1 | 8/2007 | Minervini |
| 2007/0222056 A1 | 9/2007 | Bauer et al. |
| 2008/0038577 A1 | 2/2008 | Kruger et al. |
| 2008/0048317 A1 | 2/2008 | Krueger et al. |
| 2008/0279407 A1 | 11/2008 | Pahl |
| 2009/0001553 A1 | 1/2009 | Pahl et al. |
| 2009/0071710 A1 | 3/2009 | Stelzl et al. |
| 2009/0080682 A1 | 3/2009 | Ogura et al. |
| 2009/0104415 A1 | 4/2009 | Schmajew et al. |
| 2009/0127697 A1 | 5/2009 | Pahl |
| 2011/0186943 A1 | 8/2011 | Pahl et al. |
| 2011/0210409 A1 | 9/2011 | Minervini |

FOREIGN PATENT DOCUMENTS

| | | |
|---|---|---|
| DE | 198 06 818 | 11/1999 |
| DE | 199 61 842 | 7/2001 |
| DE | 101 45 100 | 5/2002 |
| DE | 103 03 263 | 8/2004 |
| DE | 202005001559 | 6/2005 |
| DE | 10 2005 008 512 | 8/2006 |
| EP | 0077615 | 4/1983 |
| EP | 0774888 | 5/1997 |
| EP | 0 742 643 | 2/2002 |
| FR | 2 799 883 | 4/2001 |
| JP | 55-134942 | 10/1980 |
| JP | 57-100754 | 6/1982 |
| JP | 57-207500 | 12/1982 |
| JP | 61-033509 | 12/1982 |
| JP | 58-030394 | 2/1983 |
| JP | 58-203016 | 11/1983 |
| JP | 62-230297 | 10/1987 |
| JP | 03-116899 | 5/1991 |
| JP | 04-281696 | 10/1992 |
| JP | 06-334298 | 12/1994 |
| JP | 07-212180 | 8/1995 |
| JP | 07-212181 | 8/1995 |
| JP | 10-321666 | 12/1998 |
| JP | 11-508101 | 7/1999 |
| JP | 2001-157298 | 6/2001 |
| JP | 2001-339796 | 12/2001 |
| JP | 2002-134875 | 5/2002 |
| JP | 2003-078981 | 3/2003 |
| JP | 2003-508998 | 3/2003 |
| JP | 2003-304595 | 10/2003 |
| JP | 2004-079776 | 3/2004 |
| JP | 2004-229200 | 8/2004 |
| JP | 2004-537182 | 12/2004 |
| JP | 2005-198051 | 7/2005 |
| JP | 2007-060661 | 3/2007 |
| JP | 2007-524514 | 8/2007 |
| WO | WO97/01258 | 1/1997 |
| WO | WO99/43084 | 8/1999 |
| WO | WO99/56390 | 11/1999 |
| WO | WO00/42636 | 7/2000 |
| WO | WO00/70630 | 11/2000 |
| WO | WO01/19134 | 3/2001 |
| WO | WO01/20948 | 3/2001 |
| WO | WO01/26136 | 4/2001 |
| WO | WO01/41497 | 6/2001 |
| WO | WO02/15636 | 2/2002 |
| WO | WO02/17364 | 2/2002 |
| WO | WO02/045463 | 6/2002 |
| WO | WO03/017364 | 2/2003 |
| WO | WO2004/019490 | 3/2004 |
| WO | WO2005/036698 | 4/2005 |
| WO | WO2005/086532 | 9/2005 |
| WO | WO2005/086535 | 9/2005 |
| WO | WO2006/089638 | 8/2006 |
| WO | WO2006/089641 | 8/2006 |
| WO | WO2007/022249 | 2/2007 |

OTHER PUBLICATIONS

Written Opinion for PCT/EP06/001116.

Arnold D. P. et al "A Directional Acoustic Array Using Silicon Micromachined Piezoresistive Microphones" J. of Acoustic Soc. Am. vol. 113, Jan. 2003, pp. 289-298.

Becker Karl-F et al "MEMS Packaging—Technological Solutions for a Si-Microphone" Fraunhofer Inst. for Reliability and Micro Integration, Berlin; P:405-406; Mar. 2004; ISBN: 2952110514; 2952110522.

Hsieh, W. H. et al "A Micromachined Thin-film Teflon Electret Microphone" Dept. of Electrical Engineering, California Inst. of Technology ; vol. 1 P: 2B2.02 IEEE, 1997.

Lukes M. "Silicon Condenser Microphone: Electroacoustic Model and Simulation" Czech Tech. University in Prague, Faculty of Electrical Engineering, Sep. 26, 2001, pp. 57-66.

Neumann J. J. et al "A Fully-integrated CMOS-MEMS Audio Microphone" 12$^{th}$ Intl Conf. on Solid State Sensors, Actuators and Microsystems, Boston, Jun. 8-12, 2003, pp. 230-233.

Niu M-N et al "Piezoeclectric Bimorph Microphone Built on Micromachined Parylene Diaphragm" J. of Microelectrochemical Systems, vol. 12, No. 6, Dec. 2003; pp. 892-898, XP001200226, ISSN 1057-7157.

Nobuomi Imai "A New Piezoelectric Microphone with Divided Electrodes and its Applications" J. Acoust. Soc. Jpn. (E) 11,6 (1990) pp. 327-333.

Zhao Y. et al "MEMS-Based Piezoelectric Microphone for Biomedical Applications" MEMES Sensors and Actuators Lab (MSAL), Dept. of Electrical and Computer Engineering, The Inst. for Systems Research, U. of Maryland.

Bay J. et al "Design of a Silicon Microphone with Differential Readout of a Sealed Double Parallel-Plate Capacitor" Int. Conf. Eurosensors, Jun. 25, 1995, pp. 700-703, XP010305041.

Van der Donk et al "Amplitude-modulated Electromechanical Feedback System for Silicon Condenser Microphones" J. Micromech. Microeng. 2 (1992) 211-214, XP020069302.

International Search Report in Application No. PCT/EP2006/001121, dated Jul. 7, 2006.

International Preliminary Report on Patentability and Written Opinion for PCT/EP2006/001121, dated Sep. 11, 2007.

Notification of reasons for Refusal in Japanese Patent Application No. 2007-556516, dated Sep. 22, 2011.

Notification of reasons for Refusal in Japanese Patent Application No. 2008-539239, dated Sep. 22, 2011.

Gilleo, K. Handbook of flexible circuits, Gilleo, K. (ed), Van Nostrand Reinhold, 1992, pp. 145-166 [Ch. 8—Integrated Features].

International Preliminary Report on Patentability in Application No. PCT/EP05/004309, dated Nov. 29, 2006.

International Search Report and Written Opinion in Application No. PCT/EP05/004309, dated Sep. 13, 2005.

International Preliminary Report on Patentability in Application No. PCT/DE2006/001736, dated Apr. 29, 2008.

International Search Report and Written Opinion in Application No. PCT/DE2006/001736, dated Mar. 12, 2007.

International Search Report and Written Opinion in Application No. PCT/DE2006/001946, dated Feb. 22, 2007.

International Preliminary Report on Patentability in Application No. PCT/DE2006/001946, dated Jun. 11, 2008.

International Search Report and Written Opinion in Application No. PCT/DE2006/001945, dated Mar. 28, 2007.
International Preliminary Report on Patentability in Application No. PCT/DE2006/001945, dated Jun. 11, 2008.
International Search Report and Written Opinion in Application No. PCT/EP03/06596, dated Jan. 20, 2004.
International Search Report and Written Opinion in Application No. PCT/EP2005/008373, dated Nov. 8, 2005.
International Preliminary Report on Patentability and Written Opinion for PCT/EP2006/001120, dated Sep. 11, 2007.
International Search Report in Application No. PCT/EP2006/001120, dated Oct. 26, 2006.
Machine Translation of German Publication No. DE10303263A1, published Aug. 2004.
Notification of reasons for Refusal in Japanese Patent Application No. 2007-556514, dated Jul. 13, 2011.
Notification of reasons for Refusal in Japanese Patent Application No. 2007-556515, dated Jun. 23, 2011.
Action and Response History in U.S. Appl. No. 10/523,875, as retrieved from PAIR on May 19, 2009.
Action and Response History in U.S. Appl. No. 11/578,854, as retrieved from PAIR on May 19, 2009.
Action and Response History in U.S. Appl. No. 11/573,610, as retrieved from PAIR on Nov. 17, 2011.
Action and Response History in U.S. Appl. No. 11/816,960, as retrieved from PAIR on Nov. 17, 2011.
Action and Response History in U.S. Appl. No. 12/090,529, as retrieved from PAIR on Nov. 17, 2011.
Action and Response History in U.S. Appl. No. 12/092,423, as retrieved from PAIR on Nov. 17, 2011.
Action and Response History in U.S. Appl. No. 12/092,439, as retrieved from PAIR on Nov. 17, 2011.
Action and Response History in U.S. Appl. No. 13/075,936, as retrieved from PAIR on Nov. 17, 2011.
Prosecution History in Re-Exam U.S. Appl. No. 95/000,509 (RE of US6,781,231), retrieved from PAIR on Nov. 16, 2011.
Prosecution History in Re-Exam U.S. Appl. No. 95/000,513 (RE of US7,242,089), retrieved from PAIR on Nov. 16, 2011.
Prosecution History in Re-Exam U.S. Appl. No. 95/000,515 (RE of US7,242,089), retrieved from PAIR on Nov. 16, 2011.
Prosecution History in Re-Exam U.S. Appl. No. 90/009,739 (RE of US7,242,089), retrieved from PAIR on Nov. 16, 2011.
Prosecution History in Re-Exam U.S. Appl. No. 90/009,740 (RE of US6,781,231), retrieved from PAIR on Nov. 16, 2011.
Arnold et al., "MEMS-Based Acoustic Array Technology", 40th AIAA Aerospace Sciences Meeting and Exhibit, (Jan. 2002).
Arnold, David P., "A MEMS-Based Directional Acoustic Array for Aeroacoustic Measurements", Master's Thesis, Univ. of Florida (2001).
Barton et al., "Optimisation of the Coating of a Fiber Optical Sensor Embedded in a Corss-ply GFRP Laminate" Composites: Part A 33 (2002) pp. 27-34.
Bergqvist et al., "A Silicon Condenser Microphone Using Bond and Etch-Back Technology", Sensors and Actuators A, vol. 45, pp. 115-124 (1994).
Bever et al., "BICMOS Compatible Silicon Microphone Packaged as Surface Mount Device", Sensors Expo (1999).
Bouchard et al., "Dynamic Times for MEMS Microphones: MEMS Microphone Market & Supplier Analysis 2006-2013", iSuppli Corporation (2009).
Electronic Materials handbook, p. 483 (Fig. 1), ASM Int'l., (1989).
Foresight Institute, "Nano 50 Awards Announced", [online] Retrieved from the Internet:<URL: http://www.foresight.org/nanodot/?p=1990>, (Jul. 2005).
Gale, Bruce K., "MEMS Packaging", Microsystems Priciples (Oct. 2001).
Giasolli, Robert, "MEMS Packaging Introduction", (Nov. 2000).
Gilleo, "MEMS/MOEMS Packaging: Concepts, Designs, Materials & Processes", MEMS and MOEMS Packaging Challenges and Strategies, McGraw-Hill Companies, Inc., ch. 3:84-102, (2005).
Gilleo, Ken, ed., Excerpt from Area Array Packaging Handbook, (2002).

Hannenmann et al., eds., Semiconductor Packaging: A Multidisciplinary Approach (1994).
Harper, Chas. et al., Electronic Packaging, Microelectronics and Interconnection Dictionary, pp. 139, 190-191 (1993).
Harper, Chas., ed., Electronic Packaging and Interconnection Handbook, 3rd Ed., McGraw-Hill, pp. 7.34 to 7.38 (2000).
Hayes et al., "Micro-jet printing of polymers for electronics manufacturing" IEEE; pp. 168-173, XP 002342861 (1998).
Hayes et al., "Printing systems for MEMS packaging" vol. 4558, 2001, pp. 206-214, XP 002342860.
Henning et al., "Microfluidic MEMS for Semiconductor Processing", IEEE Trans. On Components, Packaging and Manufacturing Technology, Pt. B, vol. 21(4), pp. 329-37 (Nov. 1998).
Hsu, "MEMS Packaging: Fundamentals of MEMS Packaging", INSPEC, Inst. of Electrical Engineers, pp. 17-19 (2004).
Jedec Standard, "Terms, Definitions and Letter Symbols for Microelectronic Devices", JEDEC Solid State Technology Assoc., Electronic Industries Alliance, JESD99A (Rev. of Feb. 2000, Mar. 2007).
Kress et al., "Integrated Silicon Pressure Sensor for Automotice Applications with Electronic Trimming", SAE Document 950533 (1995).
Lau, John H., Ed., Ball Grid Array Technology, McGraw Hill, Inc., ISBN 0-07-036608-X, (Pub. 1995).
Luthra, Mukluk, Process challenges and solutions for embedding Chip-On-Board into mainstream SMT assembly, pp. 426-433, Proc. of the 4th Int'l. Symposium on Electronic Materials and Packaging (Dec. 2002).
Maluf, Nadim, "An Introduction to Microelectromechanical Systems Engineering; , The Box: Packaging for MEMS", ch. 6:201-203 (2000).
National Semiconductor Corp., "Acoustic Applications of Pressure Transducers", Pressure Transducer Handbook, pp. 12-1 to 12-5, (1977).
National Semiconductor Corp., "Configurations, Packaging and Environment", Pressure Transducer Handbook, pp. 4-2 to 4-5, (1977).
Oda et al., "New Nanostructured Film Making Method Using Ultra Fine Particles"; pp. 21-26 (Feb. 1997).
O'Neal, Chad et al., Challenges in the Packaging of MEMS, IEEE Int'l Symposium on Advanced Packaging Materials (1999).
Pecht, Michael, ed., Handbook of Electronic Package Design, pp. 1-5, Fig. 1.1 (1991).
Petersen et al., "Silicon Accelerometer Family; Manufactured for Automotive Applications", (1992).
Premachandran, C. S. et al., "Si-based Microphone Testing Methodology and Noise Reduction", Proc. of SPIE, vol. 4018, p. 588 (2000).
Ramesham, Rajeshuni et al., Challenges in Interconnection and Packaging of Microelectromechanical Systems (MEMS), Electronic Components and Technology Conference (2000).
Schweber & Clark, "And the statuette goes to . . . ", [online] Retrieved from the Internet<URL: www.tmworld.com/file/13638-509581. pdf?force=true>, Electronics Design, Strategy, News (EDN), (Mar. 2005).
Selmeier et al., "Recent Advances in Saw Packaging", IEEE Ultrasonics Symposium; 2001; pp. 283-292.
"Small Times Magazine Best of Small Tech Awards Recognize Micro and Nano Technologies Affecting Today's World", [online] Retrieved from the Internet: <URL: http://www.nanotechwire.com/news.asp?nid=539>, [Nov. 10, 2003].
Torkkeli et al., "Capacitive Microphone with low-stress polysilicon membrane and high-stress polysilicon back plate", Sensors and Actuators 85, pp. 116-123 (Aug. 25, 2000).
Torkkeli et al., "Capacitive Silicon Microphone", Physica Scripta, vol. T79, pp. 275-278, 1999, (Published at least by May 14, 1992).
Tummala, Rao, ed., Fundamentals of Microsystems Packaging, McGraw-Hill Companies, Inc., Ch. 14:560-561 (2001).
van Heeren, et al., "Overview of MEMS Process Technologies for high Volume Electronics", 17 pgs. (Pub. Date: 2005 or later).
Wikipedia, "Flip Chip", [online] Retrieved from the Internet: <URL: http://en.wikipedia.org/wiki/Flip_chip>, [retrieved on Nov. 15, 2011].

* cited by examiner

ELECTRICAL MODULE COMPRISING A MEMS MICROPHONE

TECHNICAL FIELD

What is described is an electrical module with a microphone integrated therein.

BACKGROUND

A microphone module with an encapsulated MEMS microphone (MEMS=Micro Electromechanical System) is known from the publication J. J. Neumann, Jr., and K. J. Gabriel, "A fully-integrated CMOS-MEMS audio microphone," 12th International Conference on Solid State Sensors, Actuators and Microsystems, 2003 IEEE, pp. 230-233. Described therein is a module having a volume for pressure equalization (back volume).

An electrical module with a built-in MEMS piezoresistive microphone is known from the publication D. P. Arnold et al., "A directional acoustic array using silicon micromachined piezorisistive microphones," J. Acoust. Soc. Am., vol. 113 (1), 2003, pp. 289-298.

In the publication Mang-Nian Niu and Eun Sok Kim, "Piezoelectric Bimorph Microphone Built on Micromachined Parylene Diaphragm," Journal of Microelectromechanical Systems, vol. 12, 2003 IEEE, pp. 892-898, a piezoelectric microphone having two piezoelectric layers of ZnO and a floating electrode arranged therebetween is described.

SUMMARY

Described herein is an electrical module with a built-in MEMS microphone that has a high signal-to-noise ratio.

An electrical module with a built-in microphone is described. The module comprises a base plate with an acoustic channel formed therein. One embodiment includes a first cavity connected via a sound inlet opening to the exterior, with a MEMS microphone chip arranged therein, and a second cavity, suitable as an acoustic back volume and connected to the acoustic channel. The microphone chip may be connected to the base plate, arranged above an opening formed in the base plate, and connected via this opening to the acoustic channel buried in the base plate.

The first cavity can coincide with the exterior. The diaphragm of the microphone chip separates the first cavity from the acoustic channel, which opens into a second cavity. The second cavity may be alongside the first cavity. The acoustic channel may run at least in part beneath the two cavities.

A pressure balance between the second cavity and the acoustic channel is possible by air interchange. A fast air interchange between the first and the second cavity—i.e., an air interchange in a period on the order of the oscillation period of the microphone diaphragm in the operating frequency range—may be prevented by the diaphragm of the microphone chip. A slow air interchange (in a period that is longer than the largest oscillation period of the microphone diaphragm in the operating frequency range) between the two cavities is nevertheless possible via a ventilation opening whose cross-sectional size is clearly smaller than the cross-sectional size of the diaphragm.

The acoustic channel may be at least sufficiently large in cross section that the pressure change in the proximity of the diaphragm of the microphone chip can be rapidly compensated. The cross-sectional size of the acoustic channel or the channel openings may be at least 5% of the diaphragm surface area.

Microphones that detect sound pressure via diaphragms are dependent on a large diaphragm excursion in reaction to the sound intensity in order to obtain the desired characteristics regarding sensitivity and noise behavior. For small components with built-in microphones, the attainable excursion is limited by the small diaphragm surface area. For this reason, only weak electrical signals can be obtained when the diaphragm excursion is transformed into an electrical variable. The compliance of a diaphragm manufactured in a separate procedure can be worsened by a high internal mechanical stress caused by a biasing of the diaphragm.

MEMS microphones described here have an air chamber (first cavity) connected to a sound input opening as well as a back volume formed by the acoustic channel and the second area. Back volume refers to enclosed air volumes, with which an acoustic short-circuit—an undesired pressure balance between front and back of the vibrating diaphragm—is prevented. For each diaphragm deflection, this air volume produces a restoring force in addition to the restoring force caused by the flexible diaphragm characteristics.

In the microphone specified here, the back volume may be formed by a horizontal acoustic channel formed in the carrier substrate below the two side-by-side cavities, and by the volume of the other cavity. With this particularly large back volume, the relative pressure changes in the back volume, caused by the diaphragm vibrations, and the associated restoring force affecting the diaphragm can be kept small.

In an embodiment, the module comprises a cover that has a separation ridge connecting two opposite side faces of the cover and sealing to the base plate. Between the base plate and the cover, for instance, the first cavity connected via a sound inlet opening to the exterior and the second cavity isolated from it by the separation ridge of the cover are formed. The sound inlet opening may be arranged in the cover.

The acoustic channel and the second cavity together form a back volume. An advantage of this embodiment is that the back volume is arranged partly in the base plate and partly thereabove. Thus a large portion of the module volume is used as the acoustic back volume.

A microphone chip comprises a carrier substrate, with a diaphragm capable of vibrating. The microphone chip may have a piezoelectric layer as well metal layers and/or electrode structures connected thereto, clamped therein above a recess or an opening.

There may be an adhesion-promoting and/or sealing mechanism, e.g., a glue layer or an epoxy resin layer, between the cover and the plate.

The microphone chip is arranged above a first opening provided in the base plate, which opens into the acoustic channel and the first cavity. The base plate has a second opening, through which the acoustic channel is connected to the second cavity. The cross-sectional size of the first opening may correspond to roughly the cross-sectional size of the microphone chip's diaphragm. The cross-sectional size of the second opening may be selected in such a way that a fast air interchange between the acoustic channel and the second cavity is possible.

With the microphone, the restoring force acting on the diaphragm can be reduced and the diaphragm excursion increased.

In an embodiment, the base plate comprises a first layer with a recess associated with the acoustic channel formed in it, and a second layer arranged above the first layer, which partly covers the recess for forming an acoustic channel up to the above-mentioned openings. The separation ridge of the cover may seal to the second layer.

The first layer of the base plate can optionally be a glass-fiber reinforced organic laminate, or contain ceramics. The first layer of the base plate can comprise several homogeneous or different dielectric sublayers arranged one above another, between which structured metal layers are arranged. The sublayers can be formed from a glass-fiber reinforced organic laminate or ceramics. The second layer of the base plate is formed with a first layer, which may include another material such as ceramic, formed like a solder stop mask (of acrylate or epoxy resin in one embodiment).

The second cavity can house at least one chip element, e.g., a resistor, a capacitor, an inductor, a filter, an impedance transformer and an amplifier. The chip element may be suitable for surface mounting.

The microphone chip can also be mounted with a flip-chip construction method and electrically connected by bumps to electrical contacts arranged on the upper side of the base plate. In another embodiment, the microphone chip can be electrically connected by bonding wires to electrical contacts arranged on the upper side of the base plate. The interfaces formed by the opposing mounting surfaces of the chip and the base plate may be sealed by adhesion, underfilling or soldering, for example. A solder frame or a frame made of potting compound may be arranged between the chip and base plate. In the case of a solder frame, it is expedient to form a solderable metallization, whose outline corresponds to the form of the frame in the lateral plane, on the upper side of the base plate and the lower surface of the microphone chip.

In one embodiment, the cover comprises a cap of plastic or ceramic coated with a conductive layer. The cover can also be formed from metal.

In case of a large acoustic pressure, such large peak-to-peak oscillation amplitudes of the diaphragm can occur that a nonlinearity in the electroacoustic transformation of the diaphragm oscillation into an electrical signal, and therefore signal distortion, results. This problem is remedied in one embodiment, in which a negative-feedback compensation circuit is connected to a diaphragm. Deflection of the diaphragm provoked by the compensation circuit opposes the deflection of the diaphragm caused by the acoustic pressure, and compensates it to a large extent, so that the diaphragm oscillates with a reduced amplitude or does not oscillate at all. The electrical parameter produced by the compensation circuit, for example, a potential, is proportional to the acoustic pressure or the signal to be detected. Any desired electrical circuit suitable for negative feedback is applicable as the compensation circuit.

According to another embodiment of the microphone, the diaphragm is clamped to the carrier substrate only at one side, while its end opposite the clamped end can oscillate freely above an opening formed in the carrier substrate when an acoustic signal is applied. Clamping on both sides is also possible, in which case only two opposite diaphragm ends are arranged above the carrier substrate. A diaphragm carrier capable of oscillation that is sealed to the carrier substrate on all sides, e.g., a flexible film, may be stretched over the opening in the carrier substrate. The diaphragm is located on the diaphragm carrier.

The following materials are suitable as a piezoelectric layer in all embodiments: ZnO, lead zirconate titanate (PZT) and aluminum nitride.

It is proposed that a diaphragm with at least one piezoelectric layer be to a large extent symmetrical regarding its layer succession and layer thickness. In particular, bending moments that develop due to different coefficients of expansion of sequential layers are compensated even for substantial temperature discontinuities. Warping of the diaphragm can therefore be avoided over a broad temperature range. This measure is particularly applicable to a bimorph diaphragm structure.

A microphone will be described in detail below on the basis of embodiments and the related figures. The figures show embodiments of different versions of the microphone on the basis of schematic representations, not drawn to scale. Identical or identically functioning parts are labeled with the same reference symbols.

DETAILED DESCRIPTION

FIGS. 1, 2A, 2B, 3A, 3B each show an electrical module with a built-in microphone chip MCH. The microphone chip can be formed, for example, in accordance with one of the configurations presented in FIGS. 4 and 5.

Figure 1:
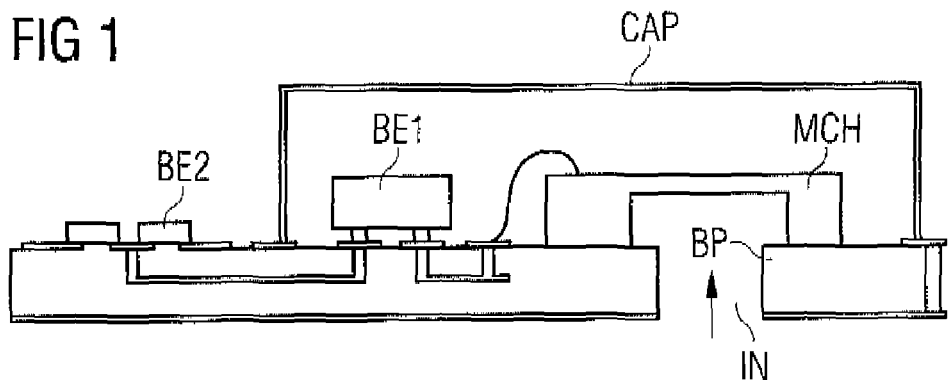
FIG. 1 schematically shows an example of an electrical module with a built-in microphone.
Figure 2A:
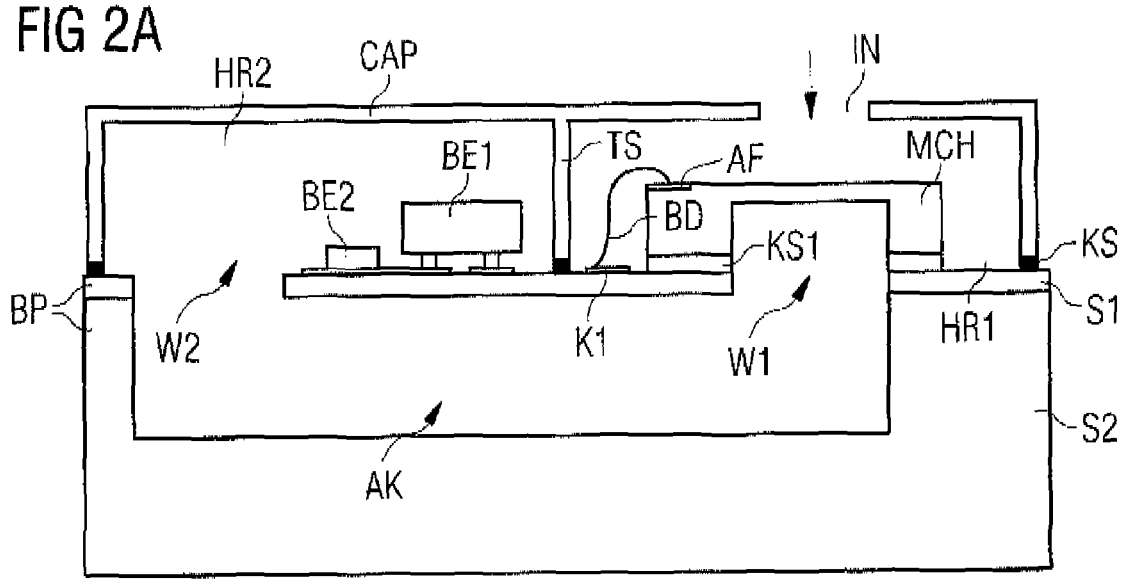
FIG. 2A, an electrical module with a microphone chip, an acoustic channel and two cavities in cross section.

Microphone chip MCH is arranged on a base plate BP above an opening formed therein—sound opening IN in FIG. 1 and/or opening W1 in FIG. 2A. Microphone chip MCH may be tightly sealed on all sides to the upper side of base plate BP, on which a cover CAP is arranged.

A closed cavity, which is used as an acoustic back volume, is formed between microphone chip MCH, the upper side of the base plate and cover CAP. In addition, a chip component BE1 electrically connected to microphone chip MCH is arranged in this cavity. Additional chip components BE2 are located on the base plate BP outside of the closed cavity. The electrical connections between the module components just mentioned are buried in part in multilayered base plate BP.

Figure 2B:
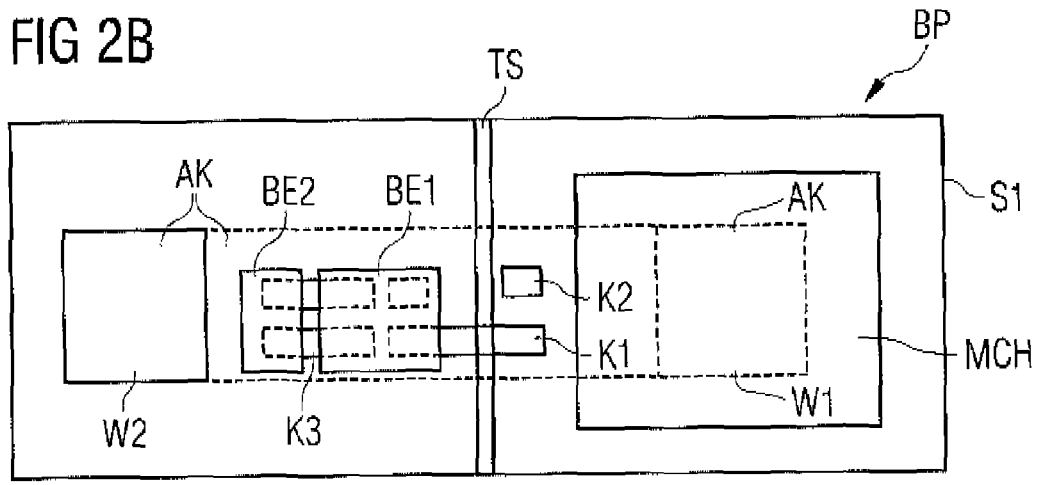
FIG. 2B, the view of the module of FIG. 2A from above.

FIGS. 2A, 2B show another embodiment of an electrical module, in which the sound inlet opening IN is formed in the cover CAP. FIG. 2A shows the electrical module in a schematic cross section, and FIG. 2B shows a schematic view of this module from above through its cover.

Base plate BP comprises a lower layer S2 and an upper layer S1 arranged thereon. In layer S2, an acoustic channel AK is provided in the form of a blind hole or a trench extending in a longitudinal direction. As viewed from above, layer S1 may cover this blind hole completely, up to a first opening W1 and a second opening W2. Layer S1 can be formed, for instance, as a solder stop mask.

A cover CAP, which has a separation ridge TS that interconnects two opposing sides of the cover, is arranged on layer S1. Cover CAP may be sealed tightly on all sides to the upper side of base plate BP or to its upper layer S1. A glue layer KS can be arranged between them for adhesion promotion or sealing.

A microphone chip MCH, which is sealed tightly on all sides to layer S1, is arranged above first opening W1 of layer S1. A sealing frame KS1 is arranged between microphone chip MCH and layer S1. Sealing frame KS1 can be formed from potting compound in one embodiment. In another embodiment, sealing frame KS1 can be formed as a solder frame.

Two cavities HR1, HR2, which are connected by acoustic channel AK and isolated from one another by microphone chip MCH arranged in first cavity HR1, are formed between the S1 and cover CAP by separation ridge TS of the cover. First cavity HR1 is connected via sound inlet opening IN to the outside.

Chip components BE1, BE2, which are electrically connected via contacts K1-K3 arranged on the base plate to one another and to microphone chip MCH, are arranged in second cavity HR2.

On the upper side of microphone chip MCH, a contact surface AF is arranged, which is electrically connected, e.g., to the first electrode of the microphone, and to an electrical contact K1 located on layer S1 via a bonding wire. The contact K2 shown in FIG. 2B may be electrically connected to the second electrode of the microphone.

The acoustic back volume is formed by an air volume enclosed in acoustic channel AK and second cavity HR2. The essential point is that acoustic channel AK connects the remote cavity HR2 to the rear side of microphone chip MCH and thus makes available an expanded back volume.

Figure 3A:
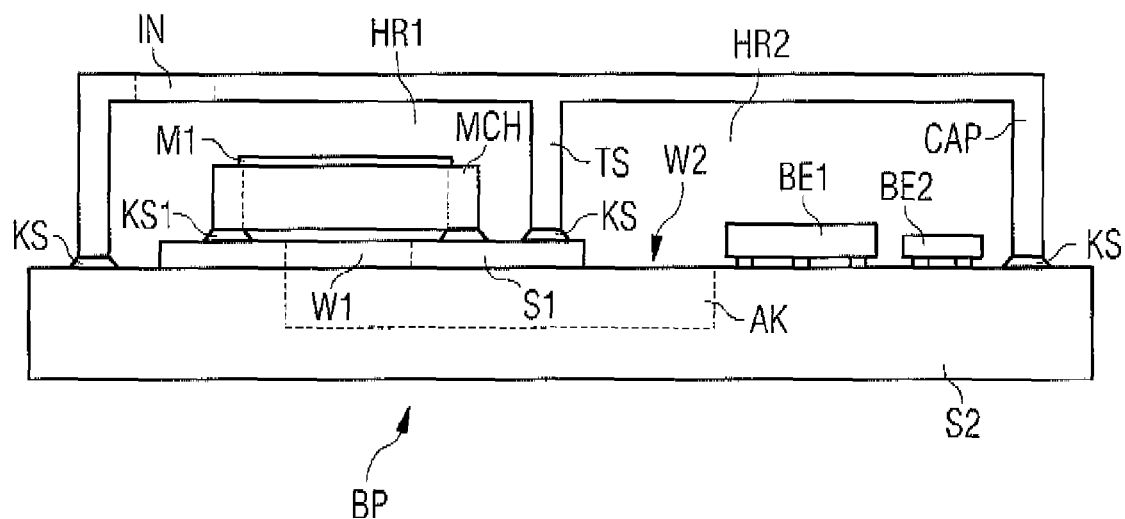
FIGS. 3A, 3B, another electrical module.
Figure 3B:
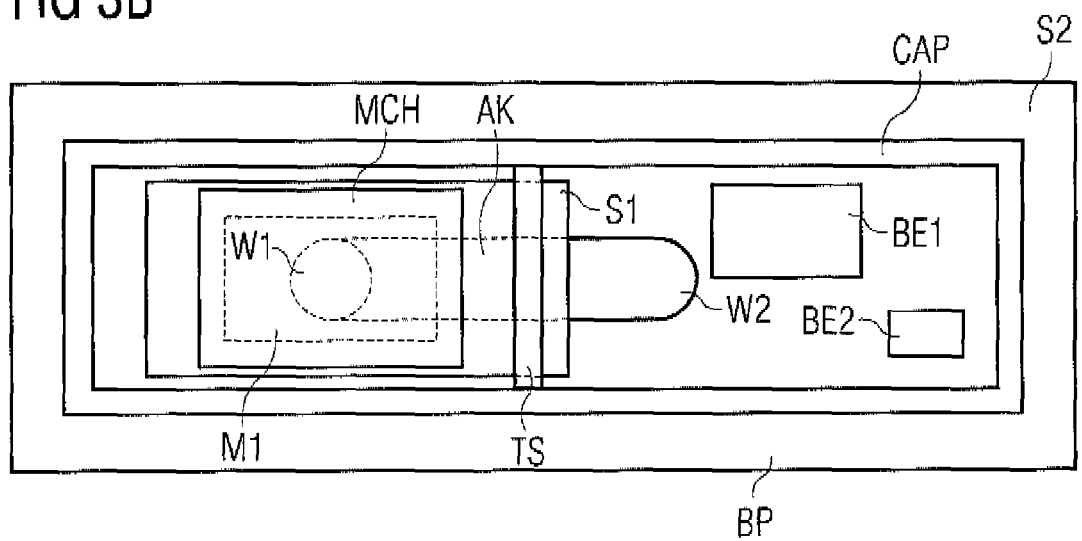

FIGS. 3A and 3B represent another electrical module with a built-in MEMS microphone in cross section and in plan view through cover CAP, respectively. Layer S1 here covers only one part of the recess provided in layer S2 for the formation of acoustic channel AK. Opening W1, which issues into acoustic channel AK and is isolated by the lower surface of microphone chip MCH and a sealing frame KS1 from first cavity HR1, is provided in layer S1.

Opening W2 connecting acoustic channel AK to second cavity HR2 is formed in that a part of layer S2, in the area of the recess formed therein, is not covered by layer S1.

In an embodiment, layer S1 is completely covered by the cover CAP, wherein separation ridge TS rests upon on this layer and is fixedly connected thereto by glue layer KS. In this example, the height of separation ridge TS is less than the height of the external walls of the cover.

Microphone chip MCH is fixedly connected to layer S1 by a frame-like glue layer KS1 (or solder layer) arranged in the peripheral area of microphone chip MCH. Thus, opening W1 of the acoustic channel is isolated from first cavity HR1. Layer KS1 serves to seal off the interface between microphone chip MCH and layer S1.

Figure 4:
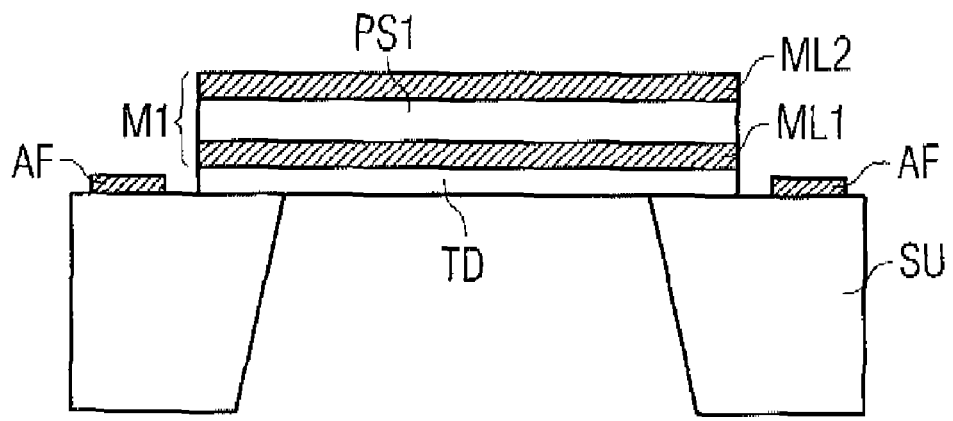
FIG. 4, a microphone with a diaphragm comprising a piezoelectric layer.

FIG. 4 shows an example of a MEMS microphone chip with a piezoelectric microphone. The microphone chip comprises a carrier substrate SU in which an opening is formed, above which a diaphragm M1 is arranged on a carrier TD capable of oscillating. The diaphragm has a piezoelectric layer PS1 arranged between two metal layers ML1, ML2. Contact surfaces AF, which are electrically connected to the electrodes formed in metal layers ML1 and/or ML2, are arranged on the upper side of carrier substrate SU.

Figure 5:
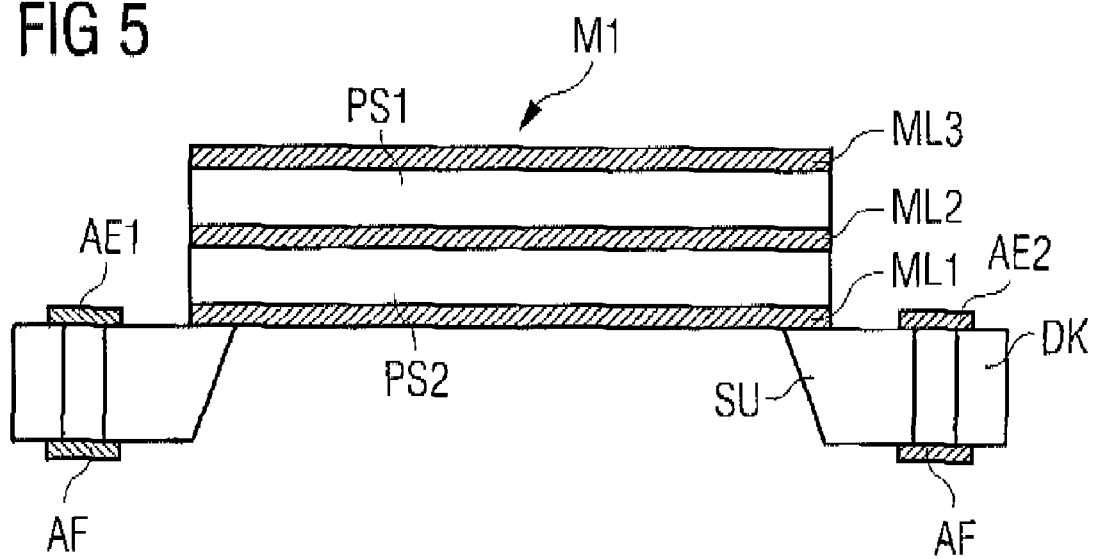
FIG. 5, a microphone with a diaphragm having a bimorph structure.

FIG. 5 shows in schematic cross section a microphone chip with a carrier substrate SU and a diaphragm M1 with a bimorph structure stretched out thereabove. Diaphragm M1 has a first piezoelectric layer PS1 arranged between an outer metal layer ML3 and a central metal layer ML2, as well as a second piezoelectric layer PS2 arranged between an outer metal layer ML1 and a central metal layer ML2. The piezoelectric axes in the two layers PS1, PS2 can be arranged in the same direction or in opposite directions.

A bimorph diaphragm structure has the advantage over a diaphragm with only one piezoelectric layer in that it is possible to obtain twice as large an electrical signal for the same diaphragm curvature, since the potentials of the two piezoelectric layers are additive.

The layer thicknesses of the layers forming diaphragm M1 may be chosen to be symmetrical relative to metal layer ML2. The piezoelectric layers have the same thickness and the same orientation of their piezoelectric axes. The two outside metal layers ML1, ML3 may be formed with equal thickness.

On the upper side of carrier substrate SU, electrical contacts AE1, AE2 are arranged, which are electrically connected on the one hand via electrical leads to electrodes formed in metal layers ML1 and ML2, and on the other hand, via plated-through holes DK to contact surfaces AF arranged on the lower surface of the carrier substrate SU.

In an embodiment, a ventilation opening, which is small in relation to the cross-sectional size of the diaphragm and serves for a slow pressure equalization in the range of $\geq 100$ ms, can be provided to connect the enclosed air volume (back volume of the microphone) to the outside. The pressure is equalized slowly in relation to the period of an acoustic signal with the largest wavelength in the operating range of the microphone. This opening can be arranged in the diaphragm or in a wall of the container enclosing the acoustic back volume.

The module is not limited to the number or the special form of the elements, microphones and/or microphone chips shown in the figures, or to the audible acoustic range from 20 Hz to 20 kHz. Additional piezoelectric acoustic sensors, such as distance sensors operating with ultrasound, are also possible. A microphone chip can be used in any desired signal processing module. Different embodiments can be combined.

It is possible to form the carrier substrate as a multilayer structure with structured printed conductors integrated therein to realize, for instance, electrical leads, inductors, capacitors and resistors.

The invention claimed is:

1. An electrical module comprising:
   a base plate having an acoustic channel that opens into a first cavity at a first end and that is closed-off by a microphone chip at a second end;
   a cover that seals to the base plate;
   wherein the microphone chip borders a second cavity that opens to an exterior of the electrical module;
   wherein the second cavity is separated from the acoustic channel by the microphone chip;
   wherein the first and second cavities are between the base plate and the cover; and
   wherein the cover comprises a separation ridge that separates the first and second cavities.

2. The electrical module of claim 1, wherein the acoustic channel comprises a tunnel extending in a longitudinal direction.

3. The electrical module of claim 1, wherein the second cavity is connected to a sound inlet opening.

4. The electrical module of claim 1, wherein the microphone chip has contact surfaces that are electrically connected, via bonding wires, to electrical contacts on an upper side of the base plate.

5. The electrical module of claim 1, wherein the microphone chip is mounted in a flip-chip configuration, and wherein the microphone chip is electrically connected, via bumps, to electrical contacts on an upper side of the base plate.

6. The electrical module of claim 1, wherein the acoustic channel runs, at least in part, below the first and second cavities.

7. The electrical module of claim 1, further comprising:
   at least one chip element in the first cavity, the at least one element comprising a resistor, a capacitor, an inductor, a filter, an impedance transformer, or an amplifier.

8. The electrical module of claim 7, wherein the microphone chip has contact surfaces that are electrically connected, via bonding wires, to electrical contacts on an upper side of a chip element.

9. The electrical module of claim 1, further comprising:
a sealing frame between the microphone chip and the base plate.

10. The electrical module of claim 9, wherein the sealing frame comprises an adhesive or a molding compound.

11. The electrical module of claim 9, wherein the sealing frame comprises a solder frame.

12. An electrical module comprising:
a base plate having an acoustic channel that opens into a first cavity at a first end and that is closed-off by a microphone chip at a second end;
wherein the microphone chip is above a first opening in the base plate; and
wherein the base plate has a second opening through which the acoustic channel is connected to the first cavity.

13. An electrical module comprising:
a base plate having an acoustic channel that opens into a first cavity at a first end and that is closed-off by a microphone chip at a second end;
wherein the base plate comprises a first layer having a recess and a second layer above the first layer in an area of the recess that forms at least two openings, the acoustic channel being in the recess.

14. The electrical module of claim 13, further comprising:
a cover that seals to the second layer, wherein the cover comprises a separation ridge that seals to the second layer and that separates the first cavity from a second cavity.

15. An electrical module comprising:
a base plate having a recess that defines an acoustic channel, the base plate comprising a first layer and a second layer, the second layer being above the first layer and above at least part of the recess to form a first opening and a second opening;
a microphone chip connected to the second layer and over the second opening;
a cover having a separation ridge, the cover and the separation ridge being sealed to the second layer, the cover being over the first opening and over the microphone chip, the separation ridge forming a first cavity over the first opening and a second cavity over the microphone chip, the first cavity being closed to an exterior of the electrical module, and the second cavity having a third opening to the exterior; and
at least one chip element electrically connected to the second layer and in the first cavity.

16. The electrical module of claim 15, wherein the microphone chip has a contact surface that is electrically connectable to a first electrode of a microphone and to an electrical contact on the second layer.

* * * * *